(12) United States Patent
Asako

(10) Patent No.: US 11,842,900 B2
(45) Date of Patent: Dec. 12, 2023

(54) ETCHING METHOD AND PLASMA PROCESSING APPARATUS

(71) Applicant: Tokyo Electron Limited, Tokyo (JP)

(72) Inventor: Ryuichi Asako, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 137 days.

(21) Appl. No.: 17/318,446

(22) Filed: May 12, 2021

(65) Prior Publication Data

US 2021/0366724 A1 Nov. 25, 2021

(30) Foreign Application Priority Data

May 21, 2020 (JP) .................................. 2020-088724

(51) Int. Cl.
*H01L 21/311* (2006.01)
*H01J 37/32* (2006.01)

(52) U.S. Cl.
CPC .. *H01L 21/31116* (2013.01); *H01J 37/32449* (2013.01); *H01L 21/31144* (2013.01); *H01J 2237/334* (2013.01)

(58) Field of Classification Search
CPC .......... H01L 21/31116; H01L 21/31144; H01J 37/32449; H01J 2237/334
See application file for complete search history.

(56) References Cited

U.S. PATENT DOCUMENTS

| | | | |
|---|---|---|---|
| 6,531,404 B1* | 3/2003 | Nallan | H01L 21/32136 438/720 |
| 7,731,862 B2* | 6/2010 | Nakagawa | C23F 4/00 216/81 |
| 2009/0004577 A1* | 1/2009 | Shim | G03F 1/36 430/5 |
| 2009/0130855 A1* | 5/2009 | Fu | H01J 37/3244 156/345.26 |
| 2019/0311909 A1* | 10/2019 | Bajaj | H01L 21/32135 |
| 2020/0279998 A1* | 9/2020 | Lin | H10N 70/063 |

FOREIGN PATENT DOCUMENTS

| | | |
|---|---|---|
| JP | 2004-519838 A | 7/2004 |
| WO | WO/02013241 A2 | 2/2002 |

OTHER PUBLICATIONS

Lee et al., Thermal Atomic Layer Etching of Titanium Nitride Using Sequential, Self-Limiting Reactions: Oxidation to TiO2 and Fluorination to Volatile TiF4, Chem. Mater. 2017, 29, 19, 8202-8210, Publication Date:Sep. 12, 2017 https://doi.org/10.1021/acs.chemmater.7b02286.*

* cited by examiner

*Primary Examiner* — Yara B Green
*Assistant Examiner* — Fakeha Sehar
(74) *Attorney, Agent, or Firm* — Studebaker & Brackett PC

(57) ABSTRACT

A disclosed etching method includes (a) etching a titanium nitride film with a first plasma, and (b) etching the titanium nitride film with a second plasma. The first plasma is generated from a first processing gas, and the second plasma is generated from a second processing gas. One of the first processing gas and the second processing gas contains a chlorine-containing gas and a fluorocarbon gas, and the other of the first processing gas and the second processing gas contains a chlorine-containing gas and does not contain a fluorocarbon gas. A repetition of a cycle including the operations (a) and (b) is performed. The repetition of the cycle is stopped in a state where the titanium nitride film is partially etched in a film thickness direction thereof.

18 Claims, 4 Drawing Sheets

ETCHING METHOD AND PLASMA PROCESSING APPARATUS

CROSS-REFERENCE TO RELATED APPLICATIONS

This application is based on and claims the benefit of priority from Japanese Patent Application No. 2020-088724 filed on May 21, 2020, the entire contents of which are incorporated herein by reference.

FIELD

An exemplary embodiment of the present disclosure relates to an etching method and a plasma processing apparatus.

BACKGROUND

Plasma etching is performed for processing a film of a substrate. Japanese Unexamined Patent Publication No. 2004-519838 (referred to as "Patent Document 1" below) discloses plasma etching for a titanium nitride film. Specifically, Patent Document 1 discloses that plasma generated from a gas containing chlorine and fluorocarbon is used in plasma etching for a titanium nitride film.

SUMMARY

In an exemplary embodiment, an etching method is provided. The etching method includes (a) etching a titanium nitride film with a first plasma. The etching method further includes (b) etching the titanium nitride film with a second plasma. The first plasma is generated from a first processing gas, and the second plasma is generated from a second processing gas. One of the first processing gas and the second processing gas contains a chlorine-containing gas and a fluorocarbon gas. The other of the first processing gas and the second processing gas contains a chlorine-containing gas and does not contain a fluorocarbon gas. In the etching method, a repetition of a cycle including the operations (a) and (b) is performed. The repetition of the cycle is stopped in a state where the titanium nitride film is partially etched in a film thickness direction thereof so that the titanium nitride film provides a bottom surface between an upper surface thereof and a lower surface thereof.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
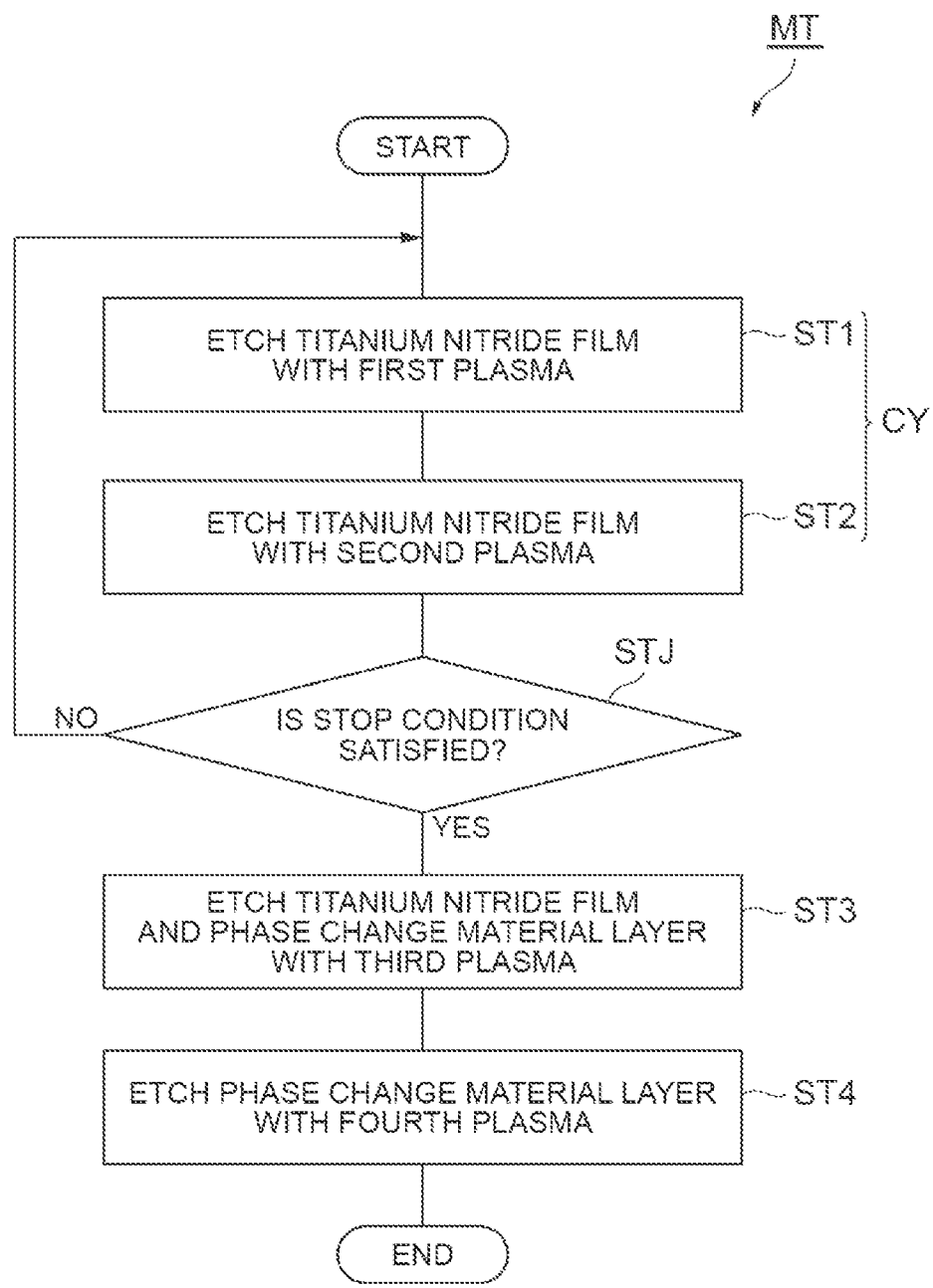
FIG. 1 is a flowchart illustrating an etching method according to an exemplary embodiment.

Hereinafter, various exemplary embodiments will be described.

In an exemplary embodiment, an etching method is provided. The etching method includes (a) etching a titanium nitride film with a first plasma. The etching method further includes (b) etching the titanium nitride film with a second plasma. The first plasma is generated from a first processing gas, and the second plasma is generated from a second processing gas. One of the first processing gas and the second processing gas contains a chlorine-containing gas and a fluorocarbon gas. The other of the first processing gas and the second processing gas contains a chlorine-containing gas and does not contain a fluorocarbon gas. In the etching method, a repetition of a cycle including the operations (a) and (b) is performed. The repetition of the cycle is stopped in a state where the titanium nitride film is partially etched in a film thickness direction thereof so that the titanium nitride film provides a bottom surface between an upper surface thereof and a lower surface thereof.

In etching by plasma generated from a processing gas that contains a chlorine-containing gas and does not contain a fluorocarbon gas, the difference in etching rates of a titanium nitride film according to pattern densities is small. However, in the etching by plasma generated from the processing gas that contains the chlorine-containing gas and does not contain the fluorocarbon gas, the roughness of the bottom surface obtained by partial etching of the titanium nitride film is large. On the other hand, in etching by plasma generated from a processing gas that contains the chlorine-containing gas and the fluorocarbon gas, the roughness of the bottom surface obtained by the partial etching of the titanium nitride film is suppressed. However, in the etching by plasma generated from the processing gas that contains the chlorine-containing gas and the fluorocarbon gas, the difference in etching rates of the titanium nitride film according to pattern densities is large. In the above embodiment, plasma etching of a titanium nitride film with the first plasma generated from the first processing gas and plasma etching of the titanium nitride film with the second plasma generated from the second processing gas are alternately performed. Thus, according to the above embodiment, the roughness of the bottom surface obtained by the partial etching of the titanium nitride film is suppressed, and the difference in etching rates of the titanium nitride film according to pattern densities is reduced.

In an exemplary embodiment, a substrate including the titanium nitride film may further include a phase change material layer. The titanium nitride film is provided on the phase change material layer. The etching method may further includes etching a portion of the titanium nitride film between the bottom surface and the lower surface and a portion of the phase change material layer in a thickness direction thereof with a third plasma generated from a third processing gas.

In an exemplary embodiment, the third processing gas may contain a bromine-containing gas. According to the embodiment, it is possible to etch the phase change layer while suppressing damage to the phase change layer.

In an exemplary embodiment, the phase change material layer may be formed of germanium, antimony, and tellurium.

In an exemplary embodiment, the etching method may further include further etching the phase change material layer with a fourth plasma generated from a fourth processing gas.

In an exemplary embodiment, the fourth processing gas may contain a hydrogen gas and a hydrocarbon gas.

In an exemplary embodiment, each of a time length of the operation (a) and a time length of the operation (b) in the cycle may be not less than 1 second and not more than 3 seconds. According to the embodiment, the roughness of the bottom surface obtained by the partial etching of the titanium nitride film is suppressed more effectively, and the difference in etching rates of the titanium nitride film according to pattern densities is reduced more effectively.

In another exemplary embodiment, a plasma processing apparatus is provided. The plasma processing apparatus includes a chamber, a substrate support, a gas supply, a plasma generator, and a controller. The substrate support is configured to support a substrate in the chamber. The gas supply is configured to supply a first processing gas and a second processing gas into the chamber. The plasma generator is configured to generate a plasma from a gas in the chamber. The controller is configured to control the gas supply and the plasma generator. One of the first processing gas and the second processing gas contains a chlorine-containing gas and a fluorocarbon gas. The other of the first processing gas and the second processing gas contains a chlorine-containing gas and does not contain a fluorocarbon gas. The controller is configured to perform a repetition of a control cycle including a first control and a second control. The first control performed by the controller includes controlling the gas supply and the plasma generator to generate a first plasma from the first processing gas in the chamber to etch a titanium nitride film of the substrate supported by the substrate support. The second control performed by the controller includes controlling the gas supply and the plasma generator to generate a second plasma from the second processing gas in the chamber to etch the titanium nitride film. The repetition of the control cycle is stopped in a state where the titanium nitride film is partially etched in a film thickness direction thereof so that the titanium nitride film provides a bottom surface between an upper surface thereof and a lower surface thereof.

Hereinafter, various exemplary embodiments will be described in detail with reference to the drawings. In the drawings, the same or equivalent portions are denoted by the same reference symbols.

FIG. 1 is a flowchart illustrating an etching method according to an exemplary embodiment. The etching method illustrated in FIG. 1 (referred to as a "method MT" below) is performed to etch a titanium nitride film of a substrate.

Figure 2:
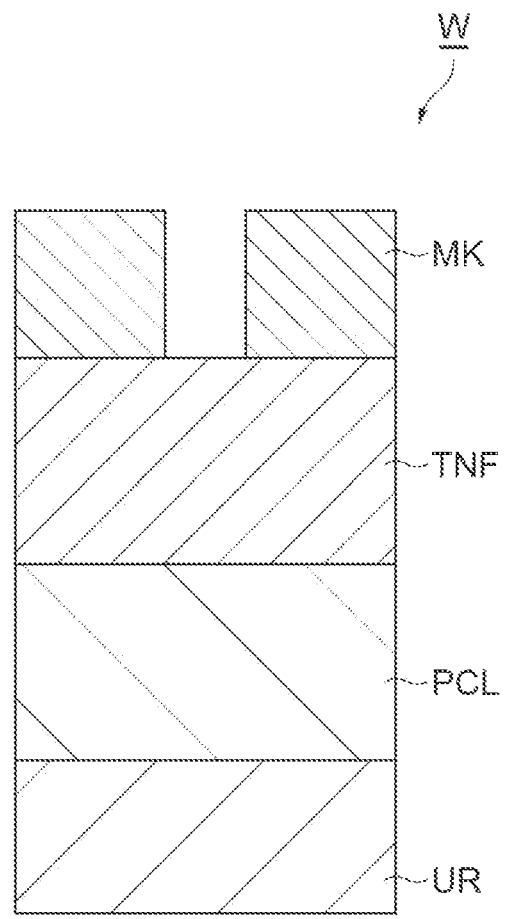
FIG. 2 is a partially-enlarged cross-sectional view of an example of a substrate.

FIG. 2 is a partially-enlarged cross-sectional view of an example of a substrate. The method MT may be applied to a substrate W illustrated in FIG. 2. The substrate W includes a titanium nitride film TNF. The substrate W may further include a layer PCL. The layer PCL is a phase change material layer. The titanium nitride film TNF is provided on the layer PCL. The substrate W including the layer PCL is used, for example, for manufacturing a phase change memory. The layer PCL is formed of a chalcogenide alloy. The layer PCL may contain germanium (Ge), antimony (Sb), and tellurium (Te). The composition of the layer PCL is, for example, $Ge_2Sb_2Te_5$.

The substrate W may further include a mask MK. The mask MK is provided on the titanium nitride film TNF. The mask MK has a pattern to be transferred to the titanium nitride film TNF. That is, the mask MK is patterned to provide patterns and spaces. The mask MK has a region for providing a relatively large space, that is, a region in which the pattern is provided at relatively low density (referred to as a "sparse region" below). In addition, the mask MK has a region for providing a relatively narrow space, that is, a region in which the pattern is provided at relatively high density (referred to as a "dense region" below).

The mask MK is formed of a material having an etching rate that is lower in Steps ST1 and ST2 than the etching rate of the titanium nitride film TNF in Steps ST1 and ST2 described later. The mask MK is formed of, for example, silicon nitride.

The substrate W may further have an underlying region UR. The layer PCL is provided on the underlying region UR. The underlying region UR is formed of, for example, silicon nitride.

Figure 3A:
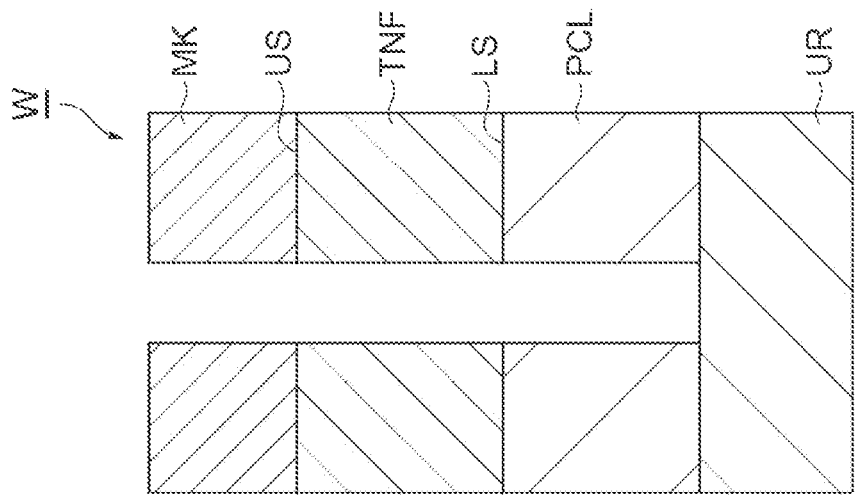
FIGS. 3A to 3C are partially-enlarged cross-sectional views of a substrate produced in respective steps of the etching method illustrated in FIG. 1.
Figure 3B:
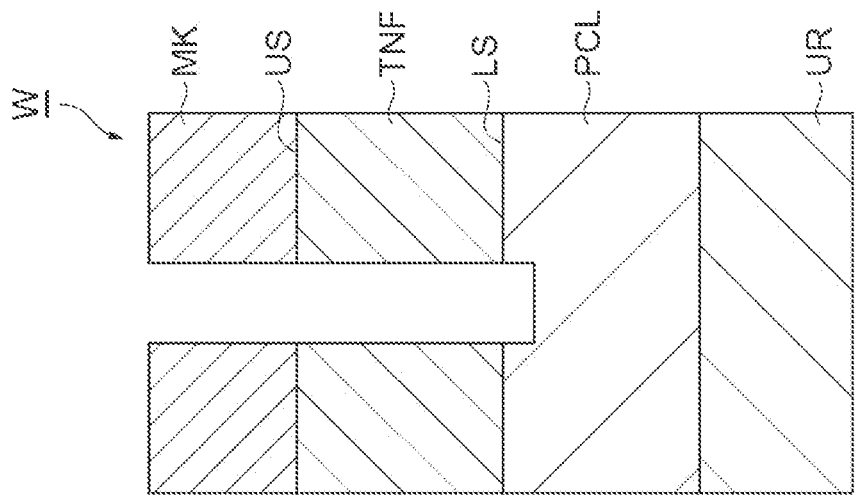
Figure 3C:
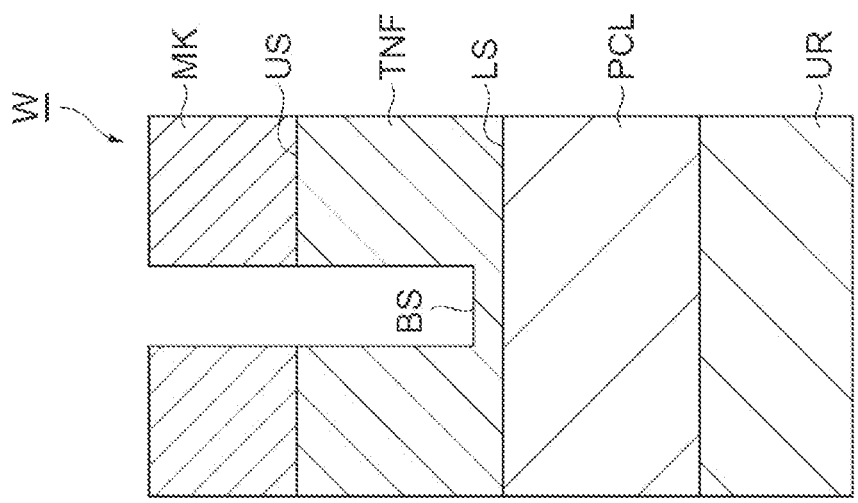

Hereinafter, description will be made with reference to FIGS. 3A to 3C along with FIGS. 1 and 2. FIGS. 3A to 3C are partially-enlarged cross-sectional views of the substrate produced in respective steps of the etching method illustrated in FIG. 1.

As illustrated in FIG. 1, the method MT includes Step ST1 and Step ST2. Steps ST1 and ST2 are performed in a state where the substrate W shown in FIG. 2 is disposed in the chamber of a plasma processing apparatus. In Step ST1, the titanium nitride film TNF is etched with a first plasma generated in the chamber. Then, in Step ST2, the titanium nitride film TNF is etched with a second plasma generated in the chamber of the plasma processing apparatus. In Steps ST1 and ST2, the titanium nitride film TNF is etched at portions exposed from the mask MK.

The first plasma in Step ST1 is generated from a first processing gas. The second plasma in Step ST2 is generated from a second processing gas. One of the first processing gas and the second processing gas contains a chlorine-containing gas and a fluorocarbon gas. The other of the first processing gas and the second processing gas contains a chlorine-containing gas and does not contain a fluorocarbon gas. The chlorine-containing gas contains, for example, one or more of $Cl_2$, HCl, $CH_3Cl$, and ClF. The fluorocarbon gas is, for example, a $CF_4$ gas.

In the method MT, a repetition of a cycle CY including Steps ST1 and ST2 is performed. The repetition of the cycle CY is stopped in a state where the titanium nitride film TNF is partially etched in a film thickness direction thereof, as illustrated in FIG. 3A. As a result of the repetition of the cycle CY, the titanium nitride film TNF provides a bottom surface BS. The bottom surface BS is provided between an upper surface US and a lower surface LS of the titanium nitride film TNF.

The method MT may include Step STJ. In Step STJ, it is determined whether or not the stop condition is satisfied. In Step STJ, for example, it is determined that the stop condition is satisfied when the number of repetitions of the cycle CY reaches a predetermined value. When the number of repetitions of the cycle CY reaches the predetermined value, the etching of the titanium nitride film TNF is stopped in a state where the titanium nitride film TNF is partially etched in the film thickness direction thereof, as illustrated in FIG. 3A. When it is determined in Step STJ that the stop condition is not satisfied, the cycle CY is performed again. When it is determined in Step STJ that the stop condition is satisfied, the repetition of the cycle CY is ended.

In etching by plasma generated from a processing gas that contains a chlorine-containing gas and does not contain a fluorocarbon gas, the difference in etching rates of a titanium nitride film according to pattern densities is small. However, in the etching by plasma generated from the processing gas that contains the chlorine-containing gas and does not contain the fluorocarbon gas, the roughness of the bottom surface obtained by partial etching of the titanium nitride film is large.

On the other hand, in etching by plasma generated from a processing gas that contains a chlorine-containing gas and a fluorocarbon gas, the roughness of the bottom surface obtained by the partial etching of the titanium nitride film is suppressed. However, in the etching by plasma generated from the processing gas that contains the chlorine-containing gas and the fluorocarbon gas, the difference in etching rates of the titanium nitride film according to pattern densities is large. Specifically, in the etching by plasma generated from the processing gas containing the chlorine-containing gas and the fluorocarbon gas, the etching rate of the titanium nitride film in the sparse region is low, and the etching rate of the titanium nitride film in the dense region is high.

In the method MT, plasma etching of the titanium nitride film TNF with the first plasma generated from the first processing gas and plasma etching of the titanium nitride film TNF with the second plasma generated from the second processing gas are alternately performed. Thus, according to the method MT, the roughness of the bottom surface BS obtained by the partial etching of the titanium nitride film TNF is suppressed, and the difference in the etching rates of the titanium nitride film TNF according the pattern densities is reduced.

In one embodiment, each of the time length of Step ST1 and the time length of Step ST2 in the cycle CY may be not less than 1 second and not more than 3 seconds. According to the embodiment, the roughness of the bottom surface BS obtained by the partial etching of the titanium nitride film TNF is suppressed more effectively, and the difference in the etching rates of the titanium nitride film TNF according to the pattern densities is reduced more effectively.

In one embodiment, the method MT may further include Step ST3. Step ST3 is performed after the repetition of the cycle CY. Step ST3 is performed in a state where the substrate W illustrated in FIG. 3A is disposed in a chamber of a plasma processing apparatus. The plasma processing apparatus used in the repetition of the cycle CY may be used to perform Step ST3. That is, the cycle CY and Step ST3 may be performed using a single plasma processing apparatus. Alternatively, Step ST3 may be performed using a plasma processing apparatus different from the plasma processing apparatus used in the repetition of the cycle CY. In a case where Step ST3 is performed using a plasma processing apparatus different from the plasma processing apparatus used in the repetition of the cycle CY, the substrate W may be transferred between these plasma processing apparatuses through a depressurized environment. That is, the substrate W may be transferred between these plasma processing apparatuses without breaking a vacuum.

In Step ST3, a portion of the titanium nitride film TNF between the bottom surface BS and the lower surface LS and a portion of the layer PCL in a thickness direction are etched with a third plasma generated in the chamber of the plasma processing apparatus. FIG. 3B illustrates an example of the state of the substrate W after Step ST3 is performed.

In Step ST3, the third plasma is generated from a third processing gas. The third processing gas may be selected so that the damage to the layer PCL by the third plasma is smaller than the damage to the layer PCL, which may occur when the layer PCL is etched by repeating the cycle CY. The third processing gas may contain a halogen gas. The third processing gas may contain another gas that dilutes the halogen gas (for example, inert gas such as a rare gas). Alternatively, the third processing gas may be a gas mixture containing a halogen gas and a $C_xH_yX_z$ gas. Here, "X" indicates a halogen element, and each of x, y, and z indicates an integer of 0 or more. The halogen gas is, for example, a $Cl_2$ gas. The $C_xH_yX_z$ gas is, for example, a hydrogen bromide gas (HBr gas), a $CH_3F$ gas, a $CHF_3$ gas, or a $CF_4$ gas. According to Step ST3, it is possible to etch the layer PCL while suppressing the damage to the layer PCL.

In one embodiment, the method MT may further include Step ST4. Step ST4 is performed after Step ST3. Step ST4 is performed in a state where the substrate W illustrated in FIG. 3B is disposed in a chamber of a plasma processing apparatus. The plasma processing apparatus used in the repetition of the cycle CY or the plasma processing apparatus used in Step ST3 may be used to perform Step ST4. The cycle CY, Step ST3, and Step ST4 may be performed using a single plasma processing apparatus. Alternatively, Step ST4 may be performed using a plasma processing apparatus different from the plasma processing apparatus used in the repetition of the cycle CY and the plasma processing apparatus used in Step ST3. When Step ST4 is performed using a plasma processing apparatus different from the plasma processing apparatus used in Step ST3, the substrate W may be transferred between these plasma processing apparatuses through a depressurized environment. That is, the substrate W may be transferred between these plasma processing apparatuses without breaking a vacuum.

In Step ST4, the layer PCL is further etched with a fourth plasma generated in the chamber of the plasma processing apparatus. As illustrated in FIG. 3C, the layer PCL may be etched in Step ST4 so that the base region UR is exposed.

In Step ST4, the fourth plasma is generated from a fourth processing gas. The fourth processing gas may contain a hydrogen gas ($H_2$ gas), a gas mixture of a hydrogen gas and a hydrocarbon gas (for example, methane gas), a hydrogen halide gas (for example, HBr gas), or one or more organic halide gases. The fourth processing gas may be a gas mixture containing one or more of a hydrogen gas, a hydrocarbon gas, a hydrogen halide gas, and one or more organic halide gases. The one or more organic halide gases may include one or more of a $CH_3F$ gas, a $CHF_3$ gas, and a $CF_4$ gas.

Figure 4:
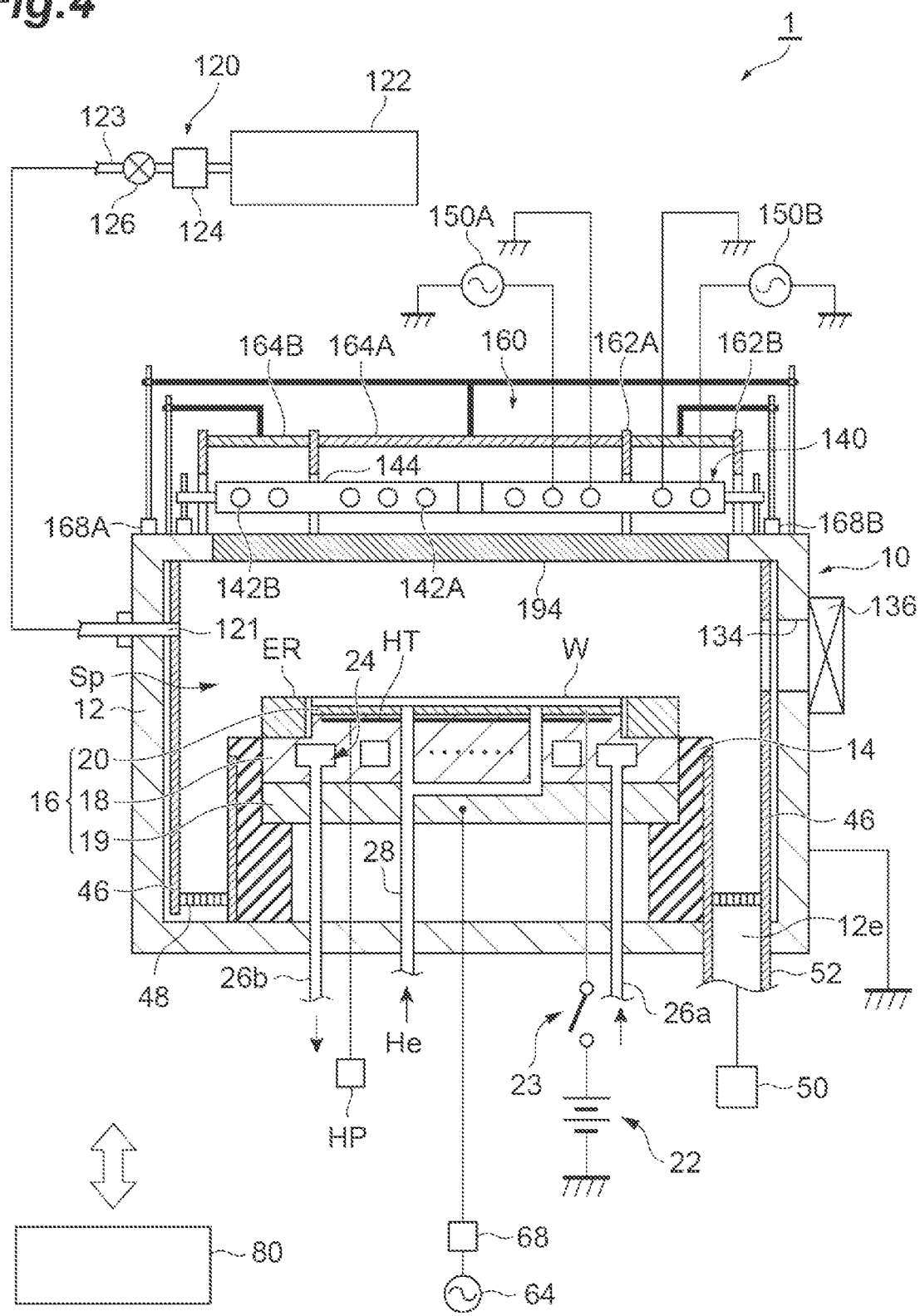
FIG. 4 schematically illustrates a plasma processing apparatus according to the exemplary embodiment.

Hereinafter, a plasma processing apparatus that may be used to perform the method MT will be described below. FIG. 4 schematically illustrates a plasma processing apparatus according to an exemplary embodiment.

A plasma processing apparatus 1 illustrated in FIG. 4 is an inductive coupling type plasma processing apparatus. The plasma processing apparatus 1 includes a chamber 10. The chamber 10 provides a space Sp therein. The plasma processing on the substrate W is performed in the space Sp. In one embodiment, the chamber 10 may include a chamber body 12. The chamber body 12 has a substantially tubular shape (for example, substantially cylindrical shape). The chamber body 12 is formed of metal such as aluminum. The space Sp is provided in the chamber body 12.

The plasma processing apparatus 1 further includes a substrate support 16. The substrate support 16 is configured to support the substrate W in the chamber 10. The substrate support 16 may be supported by a supporting portion 14. The supporting portion 14 is provided on the bottom portion of the chamber 10. The supporting portion 14 may have a substantially cylindrical shape. The supporting portion 14 may be formed of an insulating material. The insulating material of the supporting portion 14 may be quartz. The supporting portion 14 extends upward from the bottom portion of the chamber 10 in the chamber 10.

In one embodiment, the substrate support 16 may include a lower electrode 18 and an electrostatic chuck 20. The substrate support 16 may further include an electrode plate 19. The electrode plate 19 is formed of metal such as aluminum. The electrode plate 19 has a substantially disk shape.

The lower electrode 18 is provided on the electrode plate 19. The lower electrode 18 is formed of metal such as aluminum. The lower electrode 18 has a substantially disk shape. The lower electrode 18 is electrically connected to the electrode plate 19. The lower electrode 18 may provide a flow path 24 therein. The flow path 24 constitutes a temperature control mechanism. The flow path 24 is connected to a chiller unit provided outside the chamber 10, via a pipe 26a and a pipe 26b. The chiller unit supplies a refrigerant to the flow path 24 via the pipe 26a. The refrigerant supplied to the flow path 24 is returned to the chiller unit via the pipe 26b. The temperature of the substrate W supported by the substrate support 16 is controlled by controlling the temperature of the refrigerant supplied to the flow path 24.

The electrostatic chuck 20 is provided on the lower electrode 18. The substrate W is mounted on the electrostatic chuck 20. The electrostatic chuck 20 includes a body and an electrode. The body of the electrostatic chuck 20 is formed of a dielectric such as aluminum oxide or aluminum nitride. The electrode of the electrostatic chuck 20 is a film having conductivity, and is provided in the body of the electrostatic chuck 20. A DC power supply 22 is connected to the electrode of the electrostatic chuck 20 via a switch 23. When a DC voltage from the DC power supply 22 is applied to the electrode of the electrostatic chuck 20, an electrostatic attractive force is generated between the electrostatic chuck 20 and the substrate W mounted on the electrostatic chuck 20. The substrate W is held by the electrostatic chuck 20 due to the generated electrostatic attractive force.

The substrate support 16 may further support an edge ring ER mounted thereon. The edge ring ER has a substantially ring shape. The edge ring ER is formed of silicon, silicon carbide, or quartz, for example. The substrate W is disposed on the electrostatic chuck 20 and in a region surrounded by the edge ring ER.

In one embodiment, the plasma processing apparatus 1 may further include a gas supply line 28. The gas supply line 28 supplies a heat transfer gas (for example, He gas) from a heat-transfer gas supply mechanism to a gap between the upper surface of the electrostatic chuck 20 and the back surface of the substrate W.

In one embodiment, the plasma processing apparatus 1 may further include a heater HT. The heater HT may be provided in the substrate support 16 to adjust the temperature of the substrate W. The heater HT may be provided in the electrostatic chuck 20. A heater power supply HP is connected to the heater HT. When electric power is supplied to the heater HT from the heater power supply HP, the heater HT generates heat and the temperature of the substrate W is adjusted.

In one embodiment, the plasma processing apparatus 1 may further include a dielectric body 194. The dielectric body 194 may have a plate shape. The dielectric body 194 is provided above the substrate support 16. The dielectric body 194 constitutes the ceiling portion which defines the space Sp.

In one embodiment, the plasma processing apparatus 1 may further include a shield 46. The shield 46 may be detachably provided along the inner wall of the chamber 10. The shield 46 may also be provided on the outer periphery of the supporting portion 14. The shield 46 prevents adhesion of etching by-products to the chamber 10. The shield 46 may be formed, for example, by coating the surface of a member formed of aluminum with ceramics such as $Y_2O_3$.

In one embodiment, the plasma processing apparatus 1 may further include a baffle member 48. The baffle member 48 is provided between the supporting portion 14 and the side wall of the chamber 10. The baffle member 48 may be formed, for example, by coating the surface of a plate-shaped member made of aluminum with ceramics such as $Y_2O_3$. A plurality of through-holes are formed in the baffle member 48.

In one embodiment, the chamber 10 may provide an exhaust port 12e at the bottom portion of the chamber. The plasma processing apparatus 1 may further include an exhaust device 50. The exhaust device 50 is connected to the exhaust port 12e via an exhaust pipe 52. The exhaust device 50 may include a vacuum pump such as a turbo molecular pump and a pressure controller (for example, automatic pressure control valve). The exhaust device 50 can reduce the pressure in the space Sp to a designated pressure.

In one embodiment, the plasma processing apparatus 1 may further include a radio frequency power supply 64. The radio frequency power supply 64 is a power supply that generates radio frequency power for drawing ions into the substrate W, that is, radio frequency bias power. The frequency of the radio frequency bias power is, for example, from 400 kHz to 40.68 MHz. The radio frequency power supply 64 is electrically connected to the lower electrode 18 via a matcher 68. The matcher 68 includes a circuit for matching the impedance on the load side (lower electrode 18 side) of the radio frequency power supply 64 with the output impedance of the radio frequency power supply 64.

The plasma processing apparatus 1 may further include a gas supply 120. The gas supply 120 is configured to supply the first processing gas and the second processing gas described above to the space Sp. The gas supply 120 may be configured to supply the third processing gas and/or the fourth processing gas described above to the space Sp in addition to the first processing gas and the second processing gas. The chamber 10 may provide a gas inlet 121 on the side wall of the chamber. The gas supply 120 may be connected to the gas inlet 121 via a pipe 123.

The gas supply 120 may include a gas supply source 122, a flow rate controller 124, and an on-off valve 126. The gas supply source 122 includes a source of the first processing gas and a source of the second processing gas. The gas supply source 122 may further include a source of the third processing gas and/or a source of the fourth processing gas. The gas supply source 122 is connected to the space Sp through the flow rate controller 124 and the on-off valve 126. The gas supply source 122 may be connected to the pipe 123 through the flow rate controller 124 and the on-off valve 126. The flow rate controller 124 is, for example, a mass flow controller or a pressure control type flow rate controller. The gas from the gas supply source 122 is supplied into the space Sp in a state where the flow rate is adjusted by the flow rate controller 124.

The configuration of the gas supply 120 is not limited to the configuration illustrated in FIG. 4. In another embodiment, the gas supply 120 may be configured to supply the gas from the ceiling portion of the chamber 10 into the space Sp. The gas supply 120 may supply the gas into the space Sp from a gas inlet formed in, for example, the central portion of the dielectric body 194.

The plasma processing apparatus 1 further includes a plasma generator. The plasma generator is configured to generate plasma from the gas in the chamber 10. The plasma generator introduces energy into the chamber 10 to cause excitation of the gas in the chamber 10. In one embodiment, the plasma generator may include an antenna 140. The antenna 140 is a planar radio-frequency antenna and is provided above the dielectric body 194. The antenna 140 may be covered with a shield member 160.

In one embodiment, the antenna 140 may include an inner antenna element 142A and an outer antenna element 142B. The inner antenna element 142A is disposed above the central portion of the dielectric body 194. The outer antenna element 142B is disposed to surround the outer periphery of the inner antenna element 142A. Each of the inner antenna element 142A and the outer antenna element 142B is formed of, for example, a conductor such as copper, aluminum, or stainless steel. Each of the inner antenna element 142A and the outer antenna element 142B may be formed in a spiral shape.

The inner antenna element 142A and the outer antenna element 142B may be integrally fixed by a plurality of holders 144. The shape of each of the plurality of holders 144 is, for example, a rod shape. The plurality of holders 144 are arranged radially to extend from the vicinity of the center of the inner antenna element 142A to the outside of the outer antenna element 142B.

The shield member 160 may include an inner shield wall 162A and an outer shield wall 162B. The inner shield wall 162A is provided between the inner antenna element 142A and the outer antenna element 142B to surround the inner antenna element 142A. The outer shield wall 162B is provided to surround the outer antenna element 142B. The outer shield wall 162B may have a cylindrical shape. In this example, the space above the dielectric body 194 is divided into a central zone on the inner side of the inner shield wall 162A and a peripheral zone between the inner shield wall 162A and the outer shield wall 162B.

The shield member 160 may further include an inner shield plate 164A and an outer shield plate 164B. The inner shield plate 164A may have a disk shape. The inner shield plate 164A is provided above the inner antenna element 142A to close the opening of the inner shield wall 162A. The outer shield plate 164B may have a substantially annular plate shape. The outer shield plate 164B is provided above the outer antenna element 142B to close an opening between the inner shield wall 162A and the outer shield wall 162B.

A radio frequency power supply 150A and a radio frequency power supply 150B are connected to the inner antenna element 142A and the outer antenna element 142B, respectively. The radio frequency power supply 150A and the radio frequency power supply 150B supply radio frequency powers of the same frequency or different frequencies to the inner antenna element 142A and the outer antenna element 142B, respectively. The frequency of the radio frequency power supplied by each of the radio frequency power supply 150A and the radio frequency power supply 150B is 27 MHz, for example. When the radio frequency power from the radio frequency power supply 150A is supplied to the inner antenna element 142A, the inner antenna element 142A generates an induced magnetic field in the chamber 10. The generated induced magnetic field causes excitation of the gas in the chamber 10, and thus a donut-shaped plasma is generated above the central portion of the substrate W. When the radio frequency power from the radio frequency power supply 150B is supplied to the outer antenna element 142B, the outer antenna element 142B generates an induced magnetic field in the chamber 10. The generated induced magnetic field causes excitation of the gas in the chamber 10, and thus a donut-shaped plasma is generated above the peripheral edge of the substrate W.

In one embodiment, the plasma processing apparatus 1 may further include an actuator 168A and an actuator 168B. The actuators 168A and 168B are used to adjust the electrical length of the inner antenna element 142A and the electrical length of the outer antenna element 142B in accordance with the radio frequency power output from the radio frequency power supplies 150A and 150B, respectively. The actuators 168A and 168B adjust the position of the inner shield plate 164A in a height direction and the position of the outer shield plate 164B in the height direction, to adjust the electrical length of the inner antenna element 142A and the electrical length of the outer antenna element 142B, respectively.

The plasma processing apparatus 1 may further include a controller 80. The controller 80 is configured to control the units of the plasma processing apparatus 1. The controller 80 may be a computer including a processor, a storage device, an input device, a display device, and the like. The controller 80 executes a control program stored in the storage device, and controls the units of the plasma processing apparatus 1 based on recipe data stored in the storage device. The method MT may be performed in the plasma processing apparatus 1 by the controller 80 controlling the units of the plasma processing apparatus 1.

The controller 80 performs a repetition of a control cycle including a first control and a second control. The first control performed by the controller 80 includes controlling the gas supply 120 and the plasma generator to generate the first plasma from the first processing gas in the chamber 10 to etch the titanium nitride film TNF of the substrate W supported by the substrate support 16. In one embodiment, the first control includes controlling the gas supply 120 to supply the first processing gas into the chamber 10. The first control may further include controlling the exhaust device 50 to set the pressure in the chamber 10 to designated pressure. The first control further includes controlling the plasma generator to generate the plasma from the first processing gas in the chamber 10. In the first control, the controller 80 controls the radio frequency power supply 150A and the radio frequency powers supply 150B to supply radio frequency power to the inner antenna element 142A and the outer antenna element 142B, respectively. The first control may further include controlling the radio frequency power supply 64 to supply radio frequency bias power to the lower electrode 18. Step ST1 is performed by the first control of the controller 80.

The second control performed by the controller 80 includes controlling the gas supply 120 and the plasma generator to generate the second plasma from the second processing gas in the chamber 10 to etch the titanium nitride film TNF of the substrate W supported by the substrate support 16. In one embodiment, the second control includes controlling the gas supply 120 to supply the second processing gas into the chamber 10. The second control may further include controlling the exhaust device 50 to set the pressure in the chamber 10 to designated pressure. The second control further includes controlling the plasma generator to generate the plasma from the second processing gas in the chamber 10. In the second control, the controller 80 controls the radio frequency power supply 150A and the radio frequency power supply 150B to supply radio frequency powers to the inner antenna element 142A and the outer antenna element 142B, respectively. The second control may further include controlling the radio frequency power supply 64 to supply radio frequency bias power to the lower electrode 18. Step ST2 is performed by the second control of the controller 80.

The controller 80 stops the repetition of the control cycle to stop the etching of the titanium nitride film TNF in a state where the titanium nitride film TNF is partially etched in the film thickness direction thereof. When the control cycle is ended, the titanium nitride film TNF provides the bottom surface BS between the upper surface US thereof and the lower surface LS thereof.

In one embodiment, the controller 80 may further perform a third control. The third control is performed after the repetition of the control cycle described above. The third control includes controlling the gas supply 120 and the plasma generator to generate the third plasma from the third processing gas in the chamber 10 to etch the titanium nitride film TNF and a portion of the layer PCL in the substrate W supported by the substrate support 16. In one embodiment, the third control includes controlling the gas supply 120 to supply the third processing gas into the chamber 10. The third control may further include controlling the exhaust device 50 to set the pressure in the chamber 10 to designated pressure. The third control further includes controlling the plasma generator to generate the plasma from the third processing gas in the chamber 10. In the third control, the controller 80 controls the radio frequency power supply 150A and the radio frequency power supply 150B to supply radio frequency powers to the inner antenna element 142A and the outer antenna element 142B, respectively. The third control may further include controlling the radio frequency power supply 64 to supply radio frequency bias power to the lower electrode 18. Step ST3 is performed by the third control of the controller 80.

In one embodiment, the controller 80 may further perform a fourth control. The fourth control is performed after the third control. The fourth control includes controlling the gas supply 120 and the plasma generator to generate the fourth plasma from the fourth processing gas in the chamber 10 to further etch the layer PCL of the substrate W supported by the substrate support 16. In one embodiment, the fourth control includes controlling the gas supply 120 to supply the fourth processing gas into the chamber 10. The fourth control may further include controlling the exhaust device 50 to set the pressure in the chamber 10 to designated pressure. The fourth control further includes controlling the plasma generator to generate the plasma from the fourth processing gas in the chamber 10. In the fourth control, the controller 80 controls the radio frequency power supply 150A and the radio frequency power supply 150B to supply radio frequency powers to the inner antenna element 142A and the outer antenna element 142B, respectively. The fourth control may further include controlling the radio frequency power supply 64 to supply radio frequency bias power to the lower electrode 18. Step ST4 is performed by the fourth control of the controller 80.

While various exemplary embodiments have been described above, various additions, omissions, substitutions and changes may be made without being limited to the exemplary embodiments described above. Elements of the different embodiments may be combined to form another embodiment.

For example, in another embodiment, the plasma processing apparatus may be a plasma processing apparatus other than the inductive coupling type plasma processing apparatus. Such a plasma processing apparatus may be a capacitive coupling type plasma processing apparatus, an electron cyclotron resonance (ECR) plasma processing apparatus, or a plasma processing apparatus that generates plasma using a surface wave such as a microwave.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
   (a) etching a titanium nitride film of a substrate with a first plasma partially removing the titanium nitride film from the substrate; and
   (b) etching the titanium nitride film with a second plasma partially removing the titanium nitride film from the substrate, wherein
   the first plasma is generated from a first processing gas,
   the second plasma is generated from a second processing gas,
   one of the first processing gas and the second processing gas contains a chlorine-containing gas and a fluorocarbon gas,
   an other of the first processing gas and the second processing gas contains a chlorine-containing gas and does not contain a fluorocarbon gas,
   a repetition of a cycle including said (a) and said (b) is performed, and
   the repetition of the cycle is stopped in a state where the titanium nitride film is partially etched in a film thickness direction thereof so that the titanium nitride film provides a bottom surface between an upper surface thereof and a lower surface thereof.

2. The etching method according to claim 1, wherein the substrate further includes a phase change material layer,
   the titanium nitride film is provided on the phase change material layer, and
   the etching method further comprises etching a portion of the titanium nitride film between the bottom surface and the lower surface and a portion of the phase change material layer in a thickness direction thereof, with a third plasma generated from a third processing gas.

3. The etching method according to claim 2, wherein the third processing gas contains a bromine-containing gas.

4. The etching method according to claim 2, wherein the phase change material layer is formed of germanium, antimony, and tellurium.

5. The etching method according to claim 2, further comprising:
   further etching the phase change material layer with a fourth plasma generated from a fourth processing gas.

6. The etching method according to claim 5, wherein the fourth processing gas contains a hydrogen gas and a hydrocarbon gas.

7. The etching method according to claim 1, wherein each of a time length of said (a) and a time length of said (b) in the cycle is not less than 1 second and not more than 3 seconds.

8. The etching method according to claim 1, wherein the chlorine-containing gas contains at least one selected from a group consisting of $Cl_2$, HCl, $CH_3Cl$, and ClF.

9. The etching method according to claim 1, wherein the fluorocarbon gas is a $CF_4$ gas.

10. The etching method according to claim 1, wherein the substrate further includes a mask provided on the titanium nitride film.

11. The etching method according to claim 10, the mask being formed of silicon nitride.

12. The etching method according to claim 2, wherein the third processing gas contains a halogen gas.

13. The etching method according to claim 2, wherein the third processing gas contains a halogen gas and a $C_xH_yX_z$ gas, where X is a halogen element, and each of x, y, and z is an integer of 0 or more.

14. The etching method according to claim 13, wherein the halogen gas is a $Cl_2$ gas.

15. The etching method according to claim 13, wherein the $C_xH_yX_z$ gas is a HBr gas, a $CH_3F$ gas, a $CHF_3$ gas, or a $CF_4$ gas.

16. The etching method according to claim 5, wherein the fourth processing gas is at least one selected from a group consisting of a hydrogen gas, a gas mixture of a hydrogen gas and a hydrocarbon gas, a hydrogen halide gas, and one or more organic halide gases.

17. The etching method according to claim 16, wherein the one or more organic halide gases is at least one selected from a group consisting of a $CH_3F$ gas, a $CHF_3$ gas, and a $CF_4$ gas.

18. An etching method comprising:
   (a) etching a titanium nitride film of a substrate with a first plasma partially removing the titanium nitride film from the substrate; and
   (b) etching the titanium nitride film with a second plasma partially removing the titanium nitride film from the substrate, wherein
   the first plasma is generated from a first processing gas,
   the second plasma is generated from a second processing gas,
   one of the first processing gas and the second processing gas contains a chlorine-containing gas and a fluorocarbon gas,
   an other of the first processing gas and the second processing gas contains a chlorine-containing gas,
   a repetition of a cycle including said (a) and said (b) is performed, and
   the repetition of the cycle is stopped in a state where the titanium nitride film is partially etched in a film thickness direction thereof so that the titanium nitride film provides a bottom surface between an upper surface thereof and a lower surface thereof.

* * * * *